(12) United States Patent
Shokrani et al.

(10) Patent No.: US 11,081,442 B2
(45) Date of Patent: **\*Aug. 3, 2021**

(54) LOW COST METALLIZATION DURING FABRICATION OF AN INTEGRATED CIRCUIT (IC)

(71) Applicant: Skyworks Solutions, Inc., Irvine, CA (US)

(72) Inventors: Mohsen Shokrani, Greenbrook, NJ (US); Boris Gedzberg, Hillsborough, NJ (US); Ronald L. Michels, Califon, NJ (US)

(73) Assignee: Skyworks Solutions, Inc., Irvine, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 16/586,688

(22) Filed: Sep. 27, 2019

(65) Prior Publication Data

US 2020/0126902 A1    Apr. 23, 2020

Related U.S. Application Data

(60) Continuation of application No. 16/238,385, filed on Jan. 2, 2019, now Pat. No. 10,461,025, which is a division of application No. 13/279,571, filed on Oct. 24, 2011, now Pat. No. 10,199,324.

(51) Int. Cl.
*H01L 23/522* (2006.01)
*H01L 23/532* (2006.01)

(52) U.S. Cl.
CPC ........ *H01L 23/522* (2013.01); *H01L 23/5226* (2013.01); *H01L 23/53242* (2013.01); *H01L 23/53252* (2013.01)

(58) Field of Classification Search
CPC ............. H01L 23/522; H01L 23/53252; H01L 23/5226
See application file for complete search history.

(56) References Cited

U.S. PATENT DOCUMENTS 10,199,324 B1    2/2019  Shokrani et al.
10,461,025 B2 * 10/2019  Shokrani ............... H01L 23/522
2007/0045388 A1  3/2007  Farnworth et al.

\* cited by examiner

*Primary Examiner* — Douglas M Menz
(74) *Attorney, Agent, or Firm* — Knobbe Martens Olson & Bear, LLP

(57) ABSTRACT

A method for metallization during fabrication of an Integrated Circuit (IC). The IC includes a semiconductor wafer having a back surface and a front surface. The method includes etching a via hole through the semiconductor wafer. After this, a seed metal layer is deposited on the back surface of the semiconductor wafer. Thereafter, a photoresist layer is deposited on the back surface of the semiconductor wafer such that the via hole remains uncovered. After depositing the photoresist layer, a metal layer is formed along the walls of the via hole to electrically connect the back surface and the front surface of the semiconductor wafer. Finally, the photoresist layer is removed subsequent to forming the metal layer.

20 Claims, 11 Drawing Sheets

LOW COST METALLIZATION DURING FABRICATION OF AN INTEGRATED CIRCUIT (IC)

RELATED APPLICATIONS

This application is a continuation of U.S. application Ser. No. 16/238,385, filed on Jan. 2, 2019 and titled "LOW COST METALLIZATION DURING FABRICATION OF AN INTEGRATED CIRCUIT (IC)," which is hereby incorporated by reference herein in its entirety, and which is a divisional of U.S. application Ser. No. 13/279,571, filed on Oct. 24, 2011 and titled "LOW COST METALLIZATION DURING FABRICATION OF AN INTEGRATED CIRCUIT (IC)," which is hereby incorporated by reference herein in its entirety.

FIELD OF THE INVENTION

The present invention relates, in general, to Integrated Circuits (ICs). More specifically, the present invention relates to metallization during fabrication process of the ICs.

BACKGROUND

Recent years have seen advancements in the field of electronic circuits and packaging of these electronic circuits. Advancements in the Very Large Scale Integrated Circuits (VLSI) have led to miniaturization of these electronic circuits. Due to this, the electronic circuits which were implemented on Printed Circuit Boards (PCB) are now being implemented on a single semiconductor wafer. Typically, an electronic circuit implemented on a single semiconductor wafer is known as an Integrated Circuit (IC). Further, the process of implementing the electronic circuit having electronic components on a single semiconductor wafer is known as Fabrication. The conventional fabrication process is explained in conjunction with FIG. 1a, FIG. 1b, and FIG. 1c.

FIG. 1a and FIG. 1b are cross sectional diagrams of a semiconductor wafer representing fabrication steps being performed on the semiconductor wafer, in accordance with the conventional technique for fabricating an IC.

FIG. 1c is a cross sectional diagram of a fabricated semiconductor wafer, in accordance with the conventional technique for fabricating an IC.

FIG. 1a shows a semiconductor wafer 102 that has various electronic components (not shown in the figure) fabricated on its front surface 108 and its back surface 110. These electronic components, on front surface 108 and back surface 110 of semiconductor wafer 102, need to interact with each other and thus, need to be connected. For connecting the electronic components on front surface 108 and back surface 110 of semiconductor wafer 102, a via hole 106 is etched on the surface of semiconductor wafer 102. Thereafter, a seed metal layer 112 as shown in FIG. 1b is deposited on back surface 110 of semiconductor wafer 102. Seed metal layer 112 extends through via hole 106, to a capture pad 104. Thereafter, a metal layer 114 (as shown in FIG. 1c) is deposited on seed metal layer 112 which acts as an adhesive for binding metal layer 114 on back surface 110. While forming metal layer 114 (which is typically Gold (Au)) is deposited on back surface 110 of semiconductor wafer 102. Further, metal layer 114 extends along the wall of via hole 106 for electrically connecting the electronic components on back surface 110 of semiconductor wafer 102 to the electronic components on front surface 108 of semiconductor wafer 102. The process of depositing metal layer 114 for electrically connecting the electronic components on back surface 110 of semiconductor wafer 102 to the electronic components on front surface of semiconductor wafer 102 is known as metallization.

The aforesaid conventional techniques focus on depositing metal layer 114 along the walls of via hole 106 for connecting the electronic components on back surface 110 of semiconductor wafer 102 to the electronic components on front surface 108 of semiconductor wafer 102. This is achieved by depositing metal layer 114 on entire back surface 110 of semiconductor wafer 102. As a result, a large amount of metal used while depositing metal layer 114 gets wasted and it unnecessarily increases the overall fabrication cost.

In view of this, the present invention proposes an improved method of metallization such that the overall fabrication cost is reduced to a great extent. Accordingly, a huge amount of metal can be saved during metallization.

SUMMARY OF THE INVENTION

In an embodiment of the present invention, a method for metallization during fabrication of an Integrated Circuit (IC) is provided. The IC includes a wafer having a back surface and a front surface. The method includes etching a via hole through the wafer. Thereafter, a photoresist layer is deposited on the back surface of the wafer such that the via hole remains uncovered. After this activity, a metal layer is formed along walls of the via hole for electrically connecting the back surface and the front surface of the wafer.

In another embodiment of the present invention, a fabricated Integrated Circuit (IC) is provided. The fabricated IC includes a wafer having a front surface and a back surface. A via hole is etched on the wafer. The fabricated IC further includes a metal layer which is deposited along the walls of the via hole, the metal layer electrically connects the front surface and the back surface of the wafer.

In yet another embodiment of the present invention, a method for metallization during fabrication of an Integrated Circuit (IC) is provided. The IC includes a wafer having a back surface and a front surface. The method includes etching a via hole through the wafer. Thereafter, a seed metal layer is deposited on the back surface of the semiconductor wafer. Then, a photoresist layer is deposited on the back surface such that the via hole remains uncovered. Thereafter, a metal layer is formed along walls of the via hole for electrically connecting the back surface and the front surface. Lastly, the photoresist layer is removed to obtain the fabricated IC.

Various application areas for implementing the present invention may include, but are not limited to, power amplifiers for mobile phone applications.

BRIEF DESCRIPTION OF DRAWINGS

Various embodiments of the invention will, hereinafter, be described in conjunction with the appended drawings provided to illustrate and not to limit the invention, wherein like designations denote like elements, and in which.

DETAILED DESCRIPTION OF THE PREFERRED EMBODIMENTS

Figure 1A:
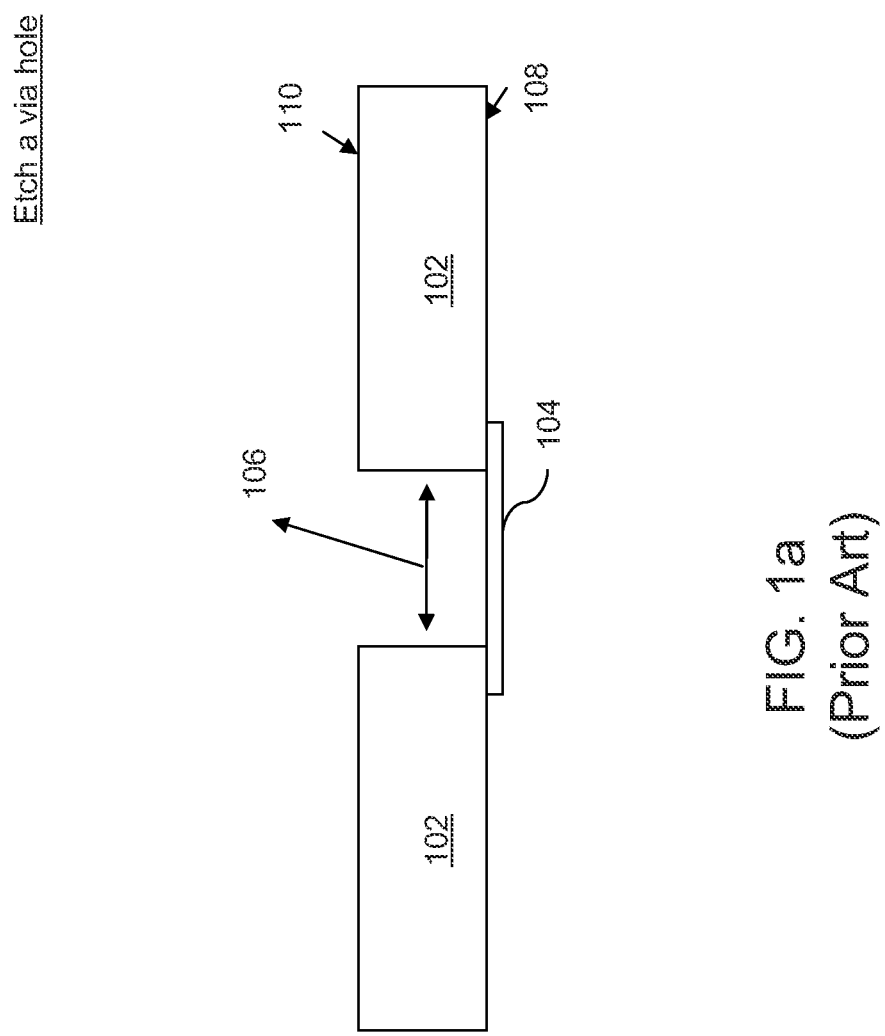
FIG. 1a, FIG. 1b, and FIG. 1c are cross sectional diagrams of a semiconductor wafer, in accordance with the conventional technique for fabricating an integrated circuit.
Figure 1B:
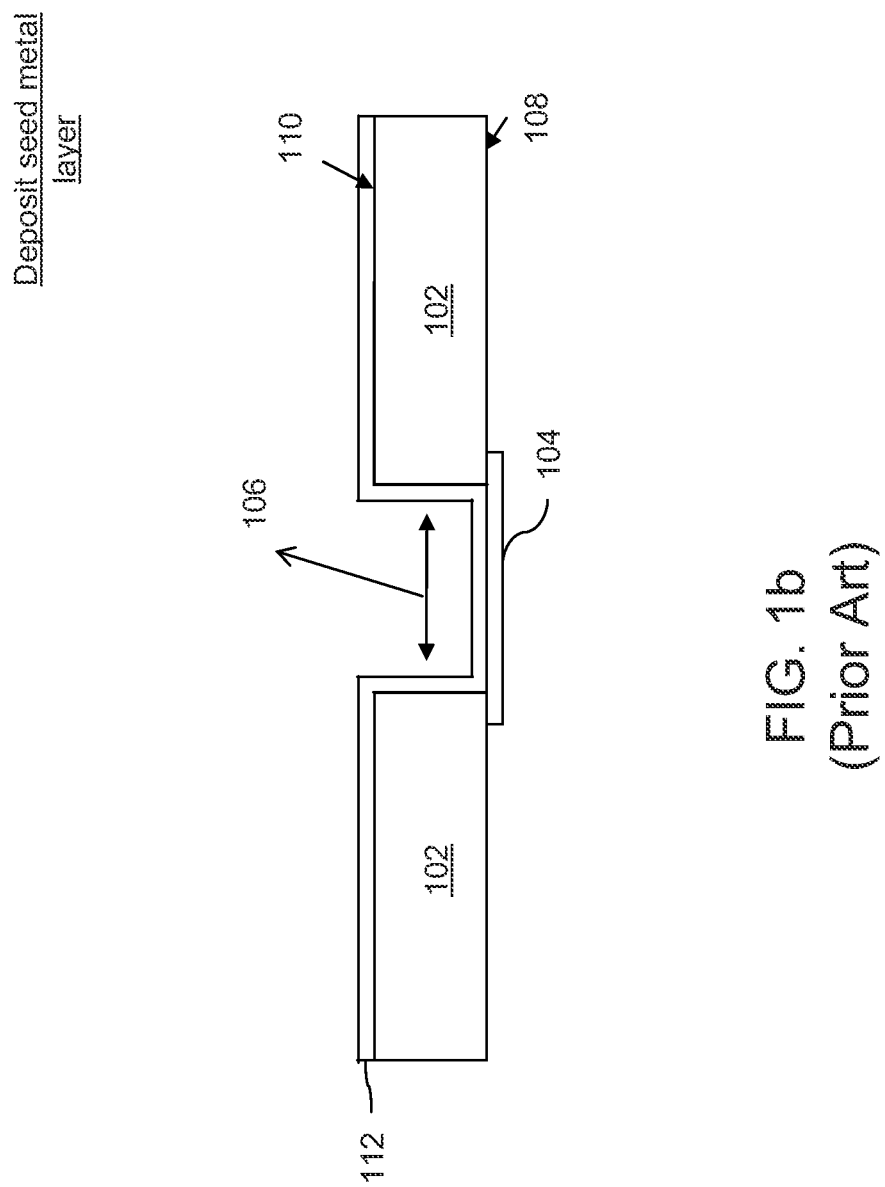
Figure 1C:
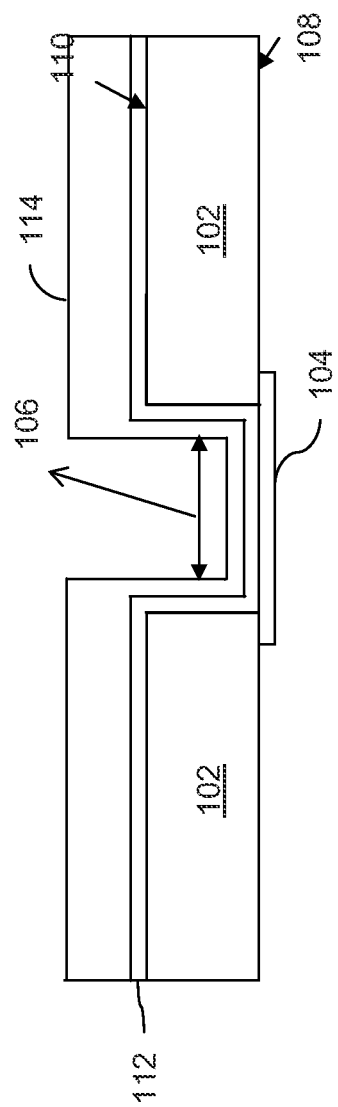

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

The present invention proposes an improved method for metallization during a fabrication process of an IC. In particular, the present invention discloses a method for metalizing only the via holes on the semiconductor wafer, thereby saving a huge amount of metal that was being used during the metallization process in the conventional solutions.

FIG. 2a, FIG. 2b, FIG. 2c, FIG. 2d, FIG. 2e, FIG. 2f, and FIG. 2g are cross sectional diagrams of a semiconductor wafer 202, in accordance with an embodiment of the present invention.

FIG. 2a, FIG. 2b, FIG. 2c, FIG. 2d, FIG. 2e, FIG. 2f, and FIG. 2g include a semiconductor wafer 202, a capture pad 204, a via hole 206, a seed metal layer 208, a photoresist layer 210, and a metal layer 212, a back surface 214, and a front surface 216. FIG. 2a, FIG. 2b, FIG. 2c, FIG. 2d, FIG. 2e, FIG. 2f, and FIG. 2g will be described in detail conjunction with FIG. 3.

Figure 3:
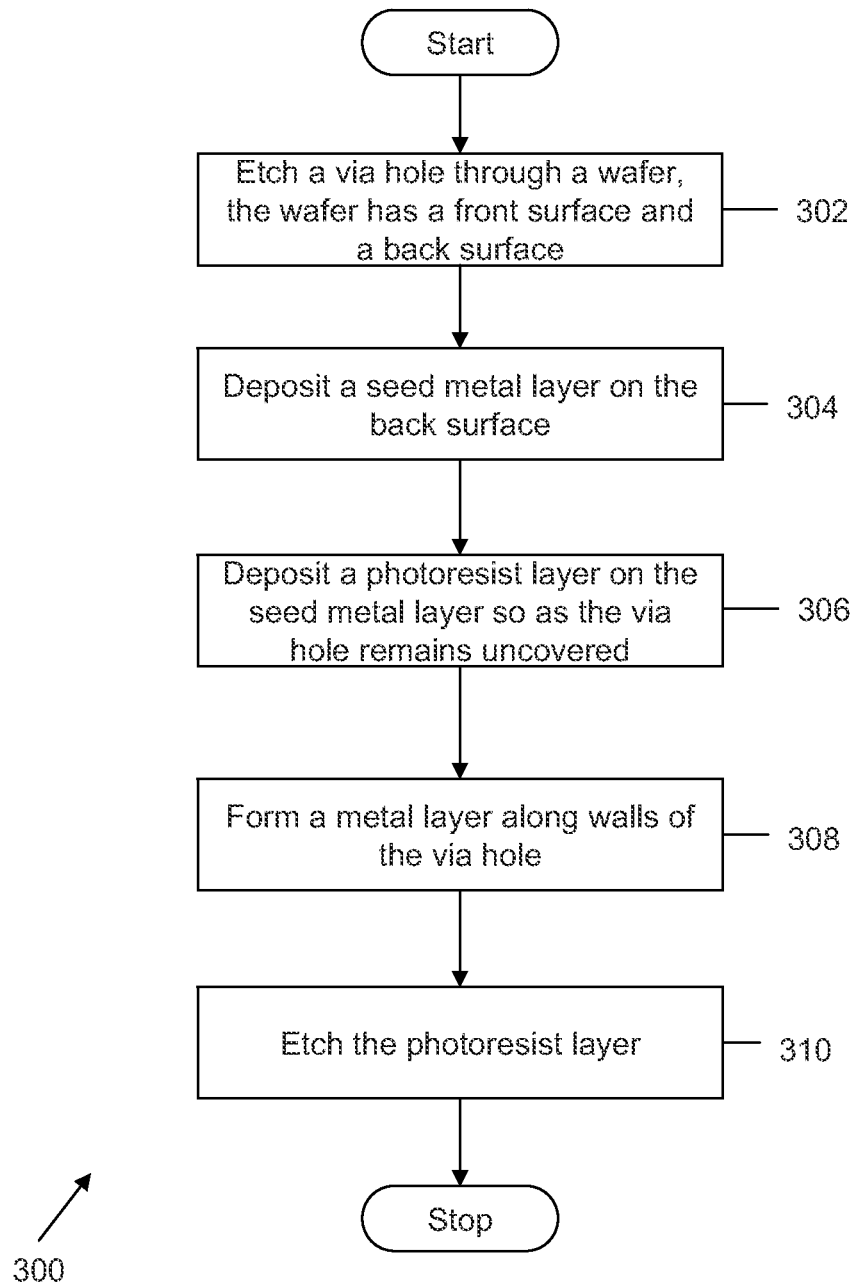
FIG. 3 is a flowchart illustrating a method for metallization during fabrication of an Integrated Circuit (IC), in accordance with an embodiment of the present invention.

FIG. 3 is a flowchart illustrating a method for metallization during the fabrication of an IC, in accordance with an embodiment of the present invention.

Figure 2A:
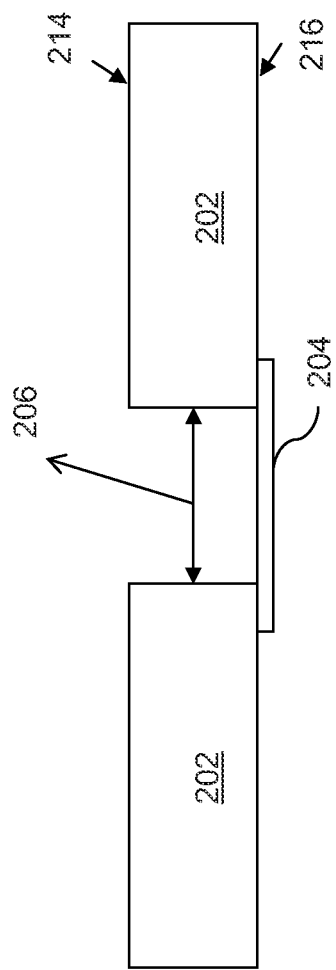
FIG. 2a, FIG. 2b, FIG. 2c, FIG. 2d, FIG. 2e, FIG. 2f, and FIG. 2g are cross sectional diagrams of a semiconductor wafer, in accordance with an embodiment of the present invention.

As shown in FIG. 2a, semiconductor wafer 202 has various electronic components fabricated on its front surface 216 and its back surface 214. In an embodiment of the present invention, semiconductor wafer 202 is a Gallium Arsenide (GaAs) wafer. In another embodiment of present invention, semiconductor wafer 202 is a Silicon (Si) wafer. These electronic components need to interact with each other and thus need to be connected. For connecting the electronic components on back surface 214 of semiconductor wafer 202 with the electronic components on front surface 216 of semiconductor wafer 202, at step 302 a via hole 206 is etched through the surface of semiconductor wafer 302. Via hole 206 connects back surface 214 of semiconductor wafer 202 with front surface 216 of semiconductor wafer 202.

Prior to etching via hole 206 on semiconductor wafer 202, a photoresist layer is deposited on back surface 214 of semiconductor wafer 202. The photoresist layer is deposited in such a way that the region on which via hole 206 is to be etched remains uncovered by the photoresist layer. As mentioned, via hole 206 is etched using various chemical etchants. In an embodiment of the present invention, chlorine based etchants may be used for etching via hole 206. Further, capture pad 204 on front surface 216 of semiconductor wafer 202 as shown in FIG. 2a, is chemically inert to the chemical etchants used for etching the semiconductor wafer 202. Thus, capture pad 204 prevents the chemical etchants from etching the semiconductor wafer 202 any further. Thereafter, the photoresist layer on the back surface 214 of the semiconductor wafer 202 is removed.

Figure 2B:
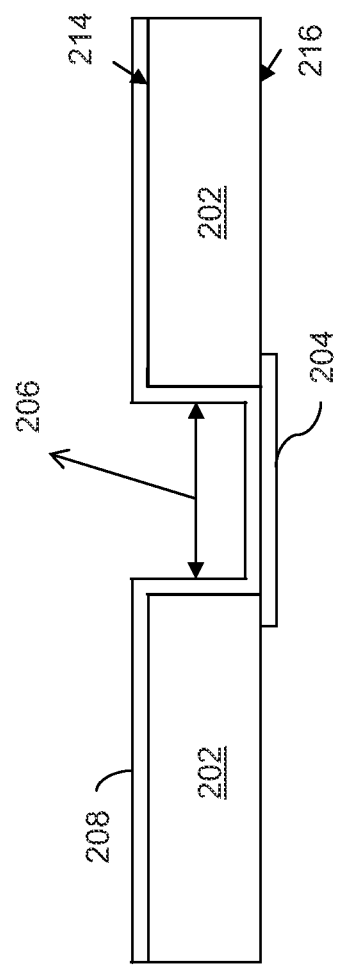

At step 304, a seed metal layer 208 as shown in FIG. 2b is deposited on back surface 214 of semiconductor wafer 202. Further, seed metal layer 208 is deposited such that it extends along the walls of via hole 206 to front surface 216 of semiconductor wafer 202. In an embodiment of the present invention, seed metal layer 208 includes an adhesive layer, a barrier layer, and a thin metal layer. The adhesive layer in seed metal layer 208 binds to semiconductor wafer 202. The barrier layer prevents the diffusion of conducting metal into semiconductor wafer 202. As disclosed, the thin metal layer carries electroplating current through out semiconductor wafer 202.

Figure 2C:
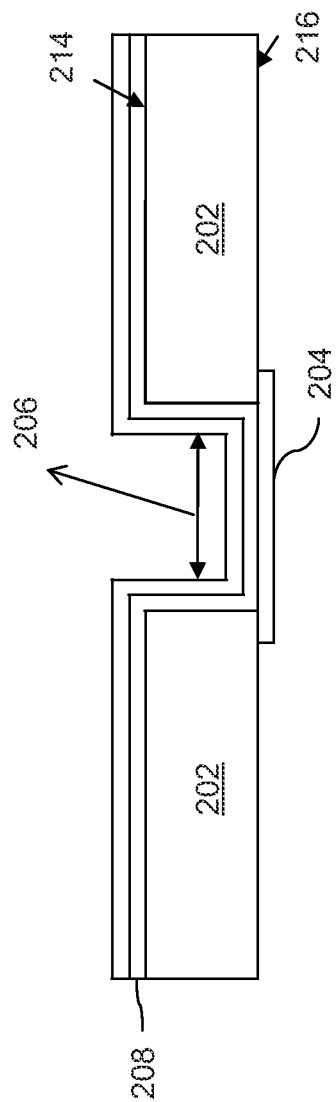

In an embodiment of the present invention, the seed metal layer 208 is thickened as depicted in FIG. 2c by depositing more material. Seed metal layer 208 can be thickened before metal layer 212 is deposited, wherein the entire process of depositing metal layer 212 is described below in detail. Further, thickening of seed metal layer 208 is an optional step which may be performed as per the requirements.

Figure 2D:
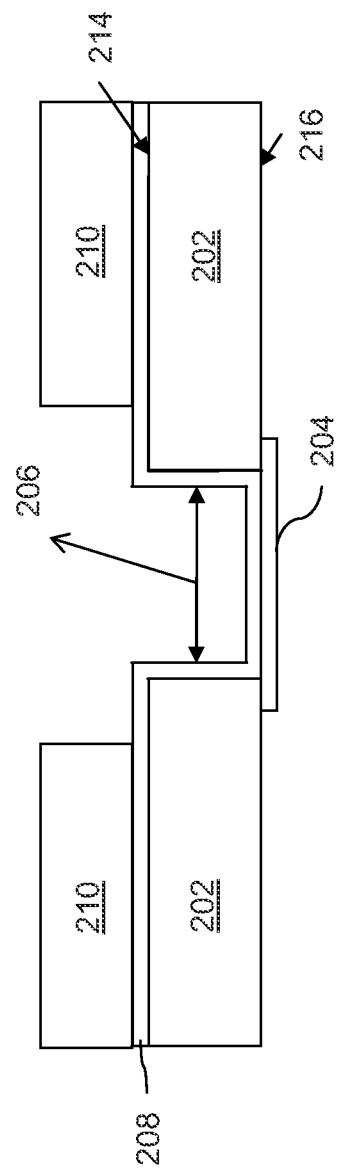
Figure 2E:
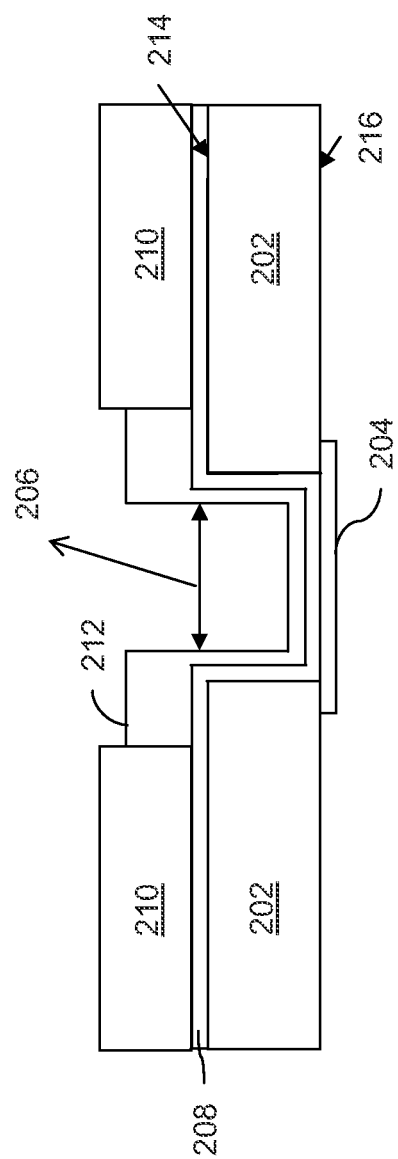

After depositing seed metal layer 208, at 306, a photoresist layer 210 (as shown in FIG. 2d) is deposited on seed metal layer 208 of semiconductor wafer 202. In an embodiment of the present invention photoresist layer 210 may be a positive photoresist layer. In another embodiment of the present invention photoresist layer 210 may be a negative photoresist layer. Photoresist layer 210 is deposited in such a way that via hole 206 remains uncovered as depicted in FIG. 2d. Further, photoresist layer 210 partially covers back surface 214 of semiconductor wafer 202. Thereafter, at 308, a metal layer 212 (as shown in FIG. 2e) is deposited on back surface 214 of semiconductor wafer 202.

Figure 2F:
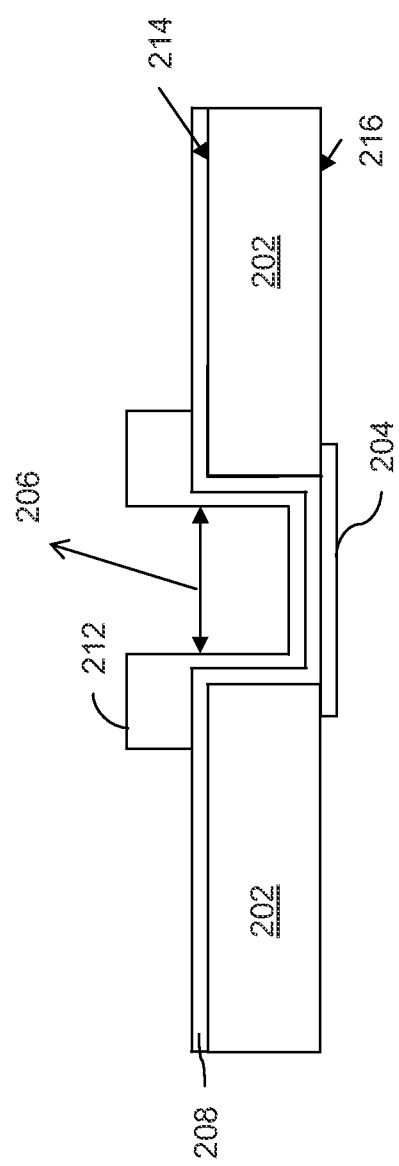
Figure 2G:
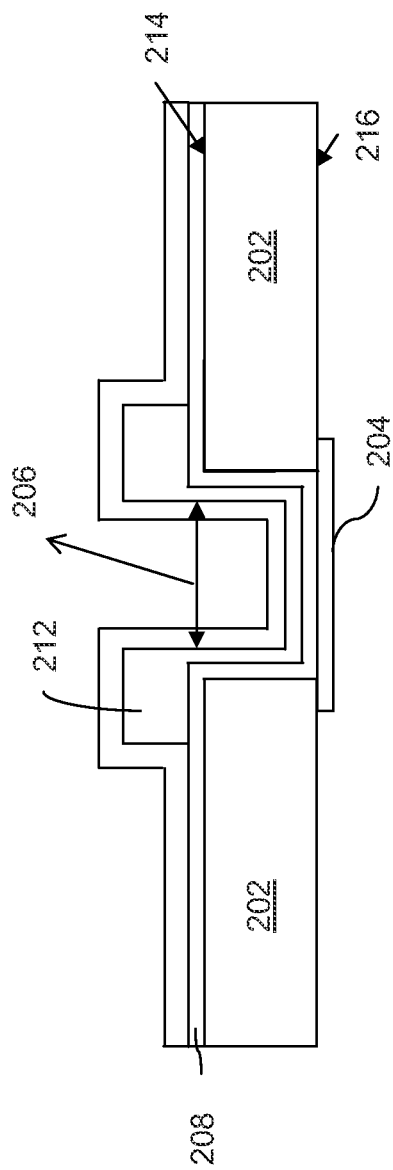

In an embodiment of the present invention, metal layer 212 is electroplated on seed metal layer 208 of semiconductor wafer 202. In an embodiment of the present invention, metal layer 212 is a Gold (Au) metal layer. In yet another embodiment metal layer 212 has thickness in a range of 1 to 10 microns. As metal layer 212 is electroplated on seed metal layer 208, metal layer 212 gets deposited on seed metal layer 208 that is not covered by photoresist layer 210. Accordingly, metal layer 208 is deposited along the walls of via hole 206 as depicted in the FIG. 2e. Capture pad 204 and metal layer 212 electrically connect the electronic components on back surface 214 of semiconductor wafer 202 to the electronic components on front surface 216 of semiconductor wafer 202. Thereafter, at 310, photoresist layer 210 is removed as depicted in FIG. 2f. In an embodiment of the present invention, subsequent to 310, seed metal layer 208 can be thickened as depicted in FIG. 2g, preferably less than thickness of metal layer 212. Finally, the fabricated IC is obtained In an embodiment of the present invention, subsequent to the depositing of seed metal layer 208 on back surface 214 of semiconductor wafer 202, a thin metal layer 212 is electroplated on seed metal layer 208. Further, the thickness of metal layer 208 is less in comparison to the thickness of the metal layer that was electroplated in conventional techniques. By using thin metal layer 212, the overall fabrication cost will be reduced. In an embodiment of the present invention, the fabricated IC can be used in mobile phone applications.

The present invention described above has numerous advantages. The present invention provides a method for metallization during a fabrication process of an Integrated Circuit (IC). The metallization is performed such that a metal layer gets deposited along the walls of a via hole. By doing so, a huge amount metal used during the metallization process is saved. As a result, metallization cost gets reduced, thereby, reducing the overall cost of fabrication process.

While the various embodiments of the invention have been illustrated and described, it will be clear that the invention is not limited only to these embodiments. Numerous modifications, changes, variations, substitutions, and equivalents will be apparent to those skilled in the art, without departing from the spirit and scope of the invention.

The invention claimed is:

1. An integrated circuit comprising:
a wafer with at least one via;
a metal layer deposited along walls of the at least one via; and
a seed layer deposited on a first surface of the wafer, the seed layer deposited prior to a photoresist layer and thickened after removal of the photoresist layer.

2. The integrated circuit of claim 1 further comprising a capture pad on a second surface of the wafer, the capture pad chemically inert to chemical etchants used to etch the wafer.

3. The integrated circuit of claim 2 wherein the capture pad and the metal layer connect a first component on the first surface to a second component on the second surface.

4. The integrated circuit of claim 1 wherein the wafer is one of a Silicon wafer or a Gallium Arsenide wafer.

5. The integrated circuit of claim 1 wherein the seed layer includes an adhesive layer, a barrier layer, and an additional metal layer.

6. The integrated circuit of claim 5 wherein the additional metal layer carries electroplating current throughout the wafer.

7. The integrated circuit of claim 5 wherein the adhesive layer binds the seed layer to the wafer.

8. The integrated circuit of claim 5 wherein the barrier layer prevents diffusion of conducting metal into the wafer.

9. The integrated circuit of claim 1 wherein the metal layer has a thickness of less than 10 microns.

10. The integrated circuit of claim 1 wherein a thickness of a portion of the metal layer within the at least one via is less than a thickness of a portion of the metal layer external to the at least one via.

11. A semiconductor wafer having a first surface and a second surface opposite to the first surface, the semiconductor wafer comprising:
a metal layer deposited along a wall of a via of the semiconductor wafer; and
a seed layer deposited on the first surface of the semiconductor wafer, the seed layer deposited prior to a photoresist layer and thickened after removal of the photoresist layer.

12. The semiconductor wafer of claim 11 wherein the seed layer includes an adhesive layer, a barrier layer, and an additional metal layer.

13. The semiconductor wafer of claim 12 wherein the additional metal layer carries electroplating current throughout the semiconductor wafer.

14. The semiconductor wafer of claim 12 wherein the adhesive layer binds the seed layer to the semiconductor wafer.

15. The semiconductor wafer of claim 12 wherein the barrier layer prevents diffusion of conducting metal into the semiconductor wafer.

16. A method for fabricating an integrated circuit, the method comprising:
etching a via through a wafer;
forming a seed layer on a first surface of the wafer prior to depositing a photoresist layer;
depositing the photoresist layer on the first surface after depositing the seed layer;
removing the photoresist layer; and
thickening the seed layer after removing the photoresist layer.

17. The method of claim 16 wherein the photoresist layer is one of a positive photoresist layer or a negative photoresist layer.

18. The method of claim 16 wherein forming the seed layer includes forming an adhesive layer, a barrier layer, and a metal layer on the first surface of the wafer.

19. The method of claim 16 further comprising forming a metal layer along a wall of the via after thickening the seed layer.

20. The method of claim 16 wherein removing the photoresist layer includes etching the photoresist layer.

* * * * *